(12) United States Patent
Klopfenstein et al.

(10) Patent No.: US 12,671,362 B2
(45) Date of Patent: Jun. 30, 2026

(54) PHOTOVOLTAIC CELL SET AND CELL MODULE WITH AN ELECTRONIC CIRCUIT HAVING A MEASUREMENT AREA

(71) Applicant: ETA SA MANUFACTURE HORLOGÈRE SUISSE, Grenchen (CH)

(72) Inventors: François Klopfenstein, Delémont (CH); Julien Bailat, Bienne (CH)

(73) Assignee: ETA SA MANUFACTURE HORLOGÈRE SUISSE, Grenchen (CH)

( * ) Notice: Subject to any disclaimer, the term of this patent is extended or adjusted under 35 U.S.C. 154(b) by 308 days.

(21) Appl. No.: 18/493,106

(22) Filed: Oct. 24, 2023

(65) Prior Publication Data

US 2024/0154572 A1     May 9, 2024

(30) Foreign Application Priority Data

Nov. 3, 2022     (EP) ..................................... 22205388

(51) Int. Cl.
H02S 50/15 (2014.01)
G04C 10/02 (2006.01)
(Continued)

(52) U.S. Cl.
CPC .............. H02S 50/15 (2014.12); G04C 10/02 (2013.01); H10F 77/215 (2025.01); H10F 77/311 (2025.01); H10F 77/315 (2025.01)

(58) Field of Classification Search
CPC .......... H02S 50/15; H02S 40/32; H02S 40/34; H02S 50/10; G04C 10/02; H10F 77/215;
(Continued)

(56) References Cited

U.S. PATENT DOCUMENTS 3,786,624 A * 1/1974 Uchiyama .............. G04C 10/02
368/205
5,025,146 A * 6/1991 Kleinschmidt ...... H04N 25/701
348/E3.028
(Continued)

FOREIGN PATENT DOCUMENTS

CN       104716902 A * 6/2015 ............. H02S 50/00
JP       2001-267604 A   9/2001
(Continued)

OTHER PUBLICATIONS

English translation of JP 2004528708 A (Year: 2004).*
(Continued)

*Primary Examiner* — Thang X Le
*Assistant Examiner* — Haidong Zhang
(74) *Attorney, Agent, or Firm* — Sughrue Mion, PLLC

(57)          ABSTRACT

A photovoltaic cell set (10). The set (10) includes at least one conductive layer (21, 23; 25, 25') over a top face of the substrate (22; 28) or a bottom faced of the substrate (22; 28) to establish an electrical contact of the photovoltaic cells (2, 12). At least one large-size first photovoltaic cell (2) is provided to capture light energy to be converted into electrical energy in a module (1). At least one small-size second photovoltaic cell (12) independent of the first photovoltaic cell (2) is provided. It is arranged to measure in the module (1) a voltage or a current to optimise the operation of the module (1).

19 Claims, 3 Drawing Sheets

(51) Int. Cl.

| | |
|---|---|
| *H01L 31/0216* | (2014.01) |
| *H01L 31/0224* | (2006.01) |
| *H10F 77/20* | (2025.01) |
| *H10F 77/30* | (2025.01) |

(58) Field of Classification Search

CPC .... H10F 77/311; H10F 77/315; H10F 77/955; H10F 19/35; H10F 19/904; H10F 19/908; H10F 19/30; H10F 77/1642; H10F 77/95; H10F 19/40; Y02E 10/50; G05F 1/67

See application file for complete search history.

(56) References Cited

U.S. PATENT DOCUMENTS

| | | | |
|---|---|---|---|
| 6,791,905 B1 * | 9/2004 | Sekiguchi | G04C 10/02 |
| | | | 368/80 |
| 2010/0097896 A1 * | 4/2010 | Baba | G04R 20/04 |
| | | | 368/205 |
| 2014/0166066 A1 | 6/2014 | Hennessy et al. | |
| 2015/0277389 A1 * | 10/2015 | Saito | G04C 10/02 |
| | | | 368/205 |
| 2018/0342637 A1 | 11/2018 | Nishiwaki et al. | |
| 2019/0155353 A1 | 5/2019 | Matsuda | |

FOREIGN PATENT DOCUMENTS

| | | | | |
|---|---|---|---|---|
| JP | 2004528708 A | * | 9/2004 | .......... H10F 77/955 |
| JP | 2010-232586 A | | 10/2010 | |
| JP | 2015-32772 A | | 2/2015 | |
| JP | 2018-198236 A | | 12/2018 | |
| JP | 2019-96421 A | | 6/2019 | |
| WO | 2022/098735 A1 | | 5/2022 | |

OTHER PUBLICATIONS

English translation of CN 104716902 A (Year: 2015).*

Davide Brunelli et al., "An Efficient Solar Energy Harvester for Wireless Sensor Nodes", Design, Automation and Test in Europe, Mar. 2008, pp. 104-109, XP058288656.

Davide Brunelli et al., "Photovoltaic scavenging systems: Modeling and optimization", Microelectronics Journal, Sep. 2009, pp. 1337-1344, vol. 40, No. 9, XP026547129.

Trishan Esram et al., "Comparison of Photovoltaic Array Maximum Power Point Tracking Techniques", IEEE Transactions on Energy Conversion, IEEE Service Center, Jun. 2007, pp. 439-449, vol. 22, No. 2, XP011184738.

G. W. Hart et al., "Experimental Tests of Open-Loop Maximum-Power-Point Tracking Techniques for Photovoltaic Arrays", Solar Cells, Dec. 1984, pp. 189-195, vol. 13, No. 2, XP001407725.

European Search Report for EP 22 20 5388 dated May 17, 2023.

\* cited by examiner

PHOTOVOLTAIC CELL SET AND CELL MODULE WITH AN ELECTRONIC CIRCUIT HAVING A MEASUREMENT AREA

CROSS-REFERENCE PARAGRAPH

This application is claims priority to European Application No 22205388.6, filed on Nov. 3, 2022, the disclosures of which are incorporated by reference herein their entireties.

TECHNICAL FIELD OF THE INVENTION

The invention relates to a photovoltaic cell set and also to a photovoltaic cell set with an electronic circuit having at least one area for measuring at least one voltage or one current.

TECHNOLOGICAL BACKGROUND

Converters in charge of collecting the energy of a photovoltaic cell are well known. Preferably, they should integrate a maximum power point tracking mechanism, which is defined by the terminology MPPT ("maximum power point tracking"). This maximum power Pmpp corresponds to an operating point MPP, which is characterized by quite specific voltage Vmpp and current Impp, also depending on the lighting level.

Different techniques are known, in particular, mention may be made of the so-called "perturb and observe" method which consists in periodically perturbing the operating voltage and observing the resulting power variation as described in the patent application WO 2013/105008 A2. Depending on the sign of this variation, the power perturbation will be held or, on the contrary, reversed. In general, this method is very effective, but could still have some drawbacks. In particular, the drawbacks are a risk of oscillation, as well as a relative complexity of electronics. This might significantly affect the electrical consumption of the regulation system in low-power systems and in watchmaking applications.

Another well-known method is the so-called "off-load voltage" ("open voltage") method as could be seen with reference to FIG. 1 of the photovoltaic cell 2 module 1 with an electronic circuit 3. This method consists in periodically measuring the off-load voltage Voc ("open circuit") of the solar cell 2 and in adapting the operating voltage, which is desirably close to Vmpp, accordingly. A simple variant consists in multiplying the off-load voltage by a constant factor, for example 80%, and afterwards adjusting the operating voltage accordingly. This method is easy to implement in an electronic circuit, but it is not ideal under all lighting conditions, because the Vmpp/Voc ratio is not perfectly constant according to lighting. A more complex variant consists in adapting the factor according to the off-load voltage. The function of the voltage Vmpp=f(Voc) should be determined beforehand, so as to be able to approximate this function later on by electronic regulation, for example using a look-up table.

A drawback of the "open voltage" method is that the energy collection shall be interrupted for a short period of time for measuring the off-load voltage Voc. In practice, the duration of this measurement depends on the time needed by the solar cell to the charge at Voc the unavoidable electrical capacitors, whether intrinsic or external, it has at its terminals. In addition, the periodicity of the measurement Voc shall be adapted to the variability of lighting. As regards a watchmaking industry application, it is possible to consider the example of a solar watch wearer moving in forest: at each footstep, at each movement of the arm, the received light could significantly vary, and the operating voltage should ideally be adapted instantaneously or frequently, for example every second. In practice, it is ineffective to interrupt energy collection at such a high frequency to measure the voltage Voc.

FIG. 1 shows a solar cell 2 module 1 with an electronic circuit 3 of the prior art, using the method for measuring the off-load voltage as partly explained hereinabove. The solar cell 2 module 1 of the prior art comprises the electronic cell 3 with components connected on an external side of the electronic circuit 3. The solar or photovoltaic cell 2 may be in the form of a dial or a bezel or a crystal of a watch, or another portion of a watch.

On one side of the module 1, the solar cell 2 is intended to capture light and convert this light into electrical energy such as a voltage loaded on a first capacitor C1. The voltage VPV loaded on the capacitor C1 is supplied to a switching controller 5 in the electronic circuit 3. An inductance L1 is also provided for in connection with the first capacitor C1 and with an input Vin of the switching controller 5, which is well-known for "step-up" type DC-DC converter circuits.

A switching timing is operated in the switching controller 5 so as to close, at determined time periods, a switch 6 arranged between the first capacitor C1 and a second capacitor C2 for measuring the off-load voltage Voc. This off-load voltage Voc is supplied to an adapter 4, which allows adapting the voltage to be transmitted to the switching collector 5 at a value corresponding for example to 80% of the average maximum value derived from the adapter 4 and adapting the operating voltage, desirably close to Vmpp, accordingly. Thus, the desired operating voltage is supplied at the output Vsup and is loaded on an output capacitor Cs.

SUMMARY OF THE INVENTION

Hence, the present invention proposes a photovoltaic cell set intended to be part of a photovoltaic cell module with an electronic circuit allowing performing a frequent and even permanent measurement of a voltage of a photovoltaic cell, or of a current of this photovoltaic cell. This allows rapidly adapting the operating point of the electronic circuit or of the entire module and overcoming the mentioned drawbacks of the prior art. The invention allows facilitating the measurement of a voltage even at a high frequency and overcoming the aforementioned drawbacks of the prior art.

This advantage is even greater as the lighting conditions change rapidly and frequently, which is typically the case of a watch worn by an active user. The combination in a photovoltaic cell set of a portion or area for measuring a voltage for example an off-load voltage and of a portion or area for capturing light energy allows performing a measurement of the voltage at all times independently of the operating frequency of the electronic circuit of the photovoltaic cell module with an electronic circuit.

To this end, the present invention relates to a photovoltaic cell set defined in the independent claim 1.

Particular embodiments of the photovoltaic cell set are defined in this disclosure.

To this end, the present invention also relates to a photovoltaic cell module with an electronic circuit having an area for measuring a voltage or a current.

Particular embodiments of the module are defined in this disclosure.

An advantage of the photovoltaic cell set for said photovoltaic cell module with an electronic circuit lies in the face that according to a first variant, the photovoltaic cell set comprises a first or several first large-size photovoltaic or solar cell(s) intended to capture the light energy to convert it into electrical energy, and an independent small-size second photovoltaic or solar cell intended to measure a voltage or a current in the electronic circuit of the module. It may consist of a measurement of an off-load voltage for example continuously or of a short-circuit current.

The first photovoltaic cell(s) may consist of thin-film cell(s).

Advantageously, the portion or area for capturing light energy intended for measuring a voltage or a current may occupy a surface area representing for example 1% of the total surface area of all photovoltaic cells. Conversely, for example with the continuous operation of the measurement of this voltage, for example of the off-load voltage, in the electronic circuit of the module or of this short-circuit current, this allows gaining practically at least 10% more electrical energy capture, which is a considerable advantage compared to the prior art.

A first photovoltaic cell of the set is a large-size one to capture light energy. The second photovoltaic cell of the set is a small-size one and is intended to serve primarily to measure a voltage or a current, for example the off-load voltage Voc or the short-circuit current in the electronic circuit of the module. Of course, it is assumed that the two types of photovoltaic cells have a very similar off-load voltage Voc according to lighting. In a watchmaking application of the present invention, the first solar cell(s) may be integrated into the dial of a watch or directly match with the shape of the watch dial, or be bonded to the watch glass. Having two types of different cells may possibly have an aesthetic drawback, since the edges of said cells could be visible. In addition, the physical separation of the two cells by an insulating area tends to reduce the active surface available for energy collection. However, as the photovoltaic cell set intended for a photovoltaic cell module with an electronic circuit is bonded to the watch dial or glass, the portions of the photovoltaic cell set, likely to be visible, could be made in the same colour as the first cell and/or the second cell so as not to distinguish them through the watch glass. Another small drawback is that, by providing for an insulating area between the two portions, this reduces to a minimum the surface of the first cell, which is intended to capture light energy to be converted into electrical energy.

Another advantage of the photovoltaic cell set intended to be part of the photovoltaic cell module with an electronic circuit lies in the fact that according to a second variant, the photovoltaic cell set for said module comprises particular characteristics of IBC-type (acronym for "interdigitated back contact") silicon cells. The idea consists in implementing a basically single-segment cell for the monocrystalline substrate and the front amorphous layer, and in insulating only the rear structure, with diffusion and metallisation. In other words, this consists in assigning a small area of the IBC cell to the measurement of a voltage, for example the off-load voltage Voc, by means of two electrically independent p and n pins or combs at the rear of the cell. It is assumed that this measurement area is significantly smaller than the main area dedicated to energy collection.

BRIEF DESCRIPTION OF THE FIGURES

The aims, advantages and features of a photovoltaic cell set intended to be part of a photovoltaic cell module with an electronic circuit having at least one area for measuring a voltage or a current will appear better in the following non-limiting description with reference to the drawings, wherein.

DETAILED DESCRIPTION OF THE INVENTION

In the following description, all of the components of a photovoltaic cell set intended to be part of a photovoltaic cell module with an electronic circuit are described. All measurement base components that are well-known in the technical field will be briefly described. The structure of the photovoltaic cell set for a photovoltaic cell module with an electronic circuit and its design will be primarily described.

As explained hereinafter in particular in FIG. 2 in a first variant, the photovoltaic cell 2 and 12 set 10 may be placed on a support, such as on a glass plate which may form the glass of a watch worn primarily at the wrist. The two photovoltaic cells 2 and 12 are capable of capturing light energy in order to convert it into electrical energy, but the smaller second cell 12 is used for the measurement of a voltage, for example of the off-load voltage, and possibly also for the measurement of a current, for example of a short-circuit current. Laser machining may be performed through the glass since it is an insulator and it is also transparent. For the cell of the measurement of the off-load voltage, the measured output power is equal to zero thereby the specific designation of off-load voltage.

Figure 2:
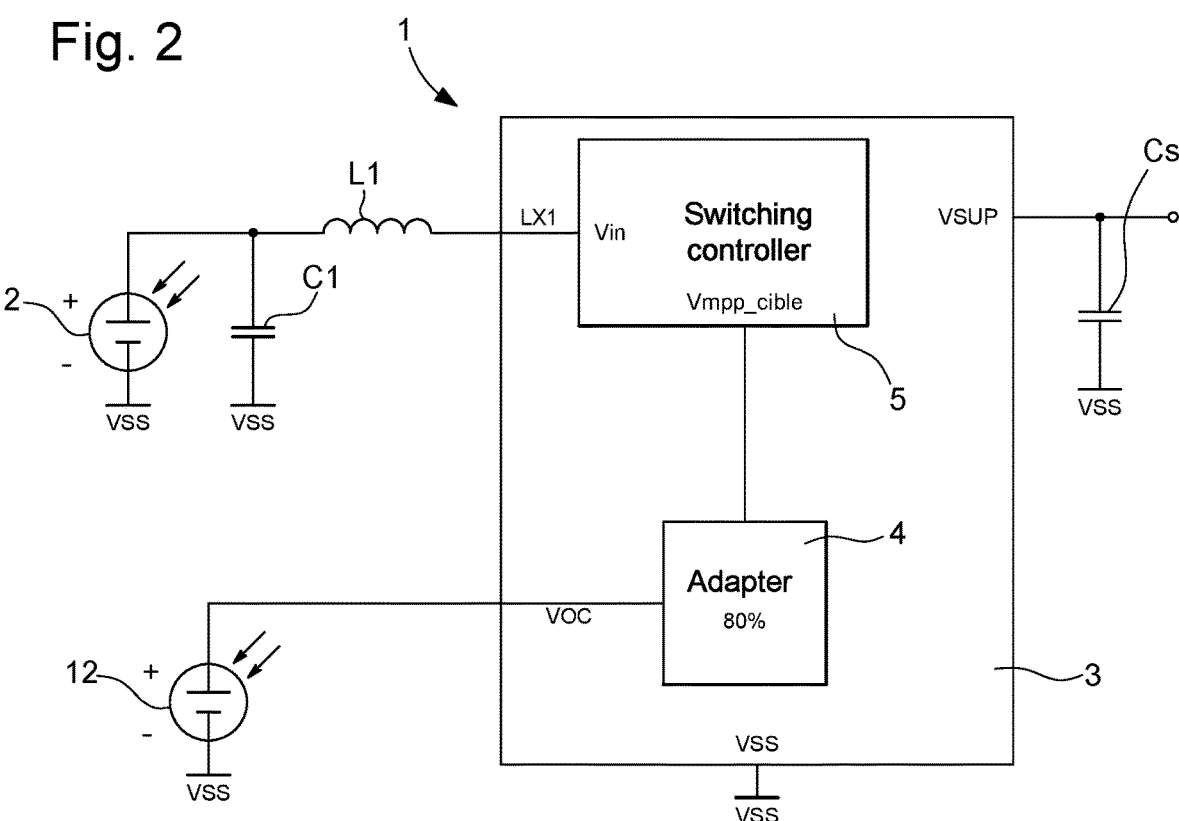
FIG. 2 shows a photovoltaic cell module according to the invention, which is provided with an electronic circuit for processing data.

FIG. 2 shows the photovoltaic cell 2, 12 module 1 with an electronic circuit 3. A few electronic components still connect the base of the electronic circuit 3 and the photovoltaic cell(s) 2, 12 of the present invention. Said module 1 also comprises one or more photovoltaic or solar cell(s) 2, 12 connected to an electronic circuit 3, as well as the different electronic components connecting the photovoltaic cell(s) and the base of the electronic circuit 3. It may be considered to have a first cell or several first photovoltaic cells 2 connected together so as to form for example a watch dial or to be arranged over a support, such as a watch glass and at least one second photovoltaic cell 12 for measuring the off-load voltage which, in fine, is a small photovoltaic or solar cell. This second solar cell is arranged to be able to independently perform a measurement of the off-load voltage Voc, but may also be arranged to measure a short-circuit current in the module 1. This small photovoltaic cell may be connected at all times and in particular continuously as of the beginning of the measurement of the off-load voltage without being disconnected. Thus, thanks to this small photovoltaic cell 12, it is possible to supply a piece of information to adapt the operating point of the electronic circuit 3 or of the entirety of the module 1 comprising it.

As shown in FIG. 2, the module 1 comprises at least one first photovoltaic or solar cell 2 for capturing the light energy and converting it into electrical energy, which is loaded on the positive side on an input capacitor C1 also connected to the ground Vss on the negative side. The module 1 further comprises an inductance L1 connecting the positive side of the input capacitor C1 to an input voltage terminal Vin of the switching controller 5 in the electronic circuit 3, which is well known for "step-up" type DC-DC converter circuits. This switching controller 5 may be timed by a data base or by a local oscillator partly composed by the connecting LX1 inductance L1. However, the time base or the timing oscillator may also be completely integrated into the switching controller 5 or the electronic circuit 3 to time all operations in particular of the switching controller 5.

The electronic circuit 3 also comprises an adapter 4 which is connected to the switching controller 5 and directly to the second photovoltaic or solar cell 12. There may be a communication of configuration parameters between the switching controller 5 and the adapter 4 relating to a determined voltage level, i.e. a target value Vmpp_cible to be provided for the proper operation of the module. The adapter 4 receives, at all times and in particular continuously, a measurement signal of a voltage or of a current, for example of the off-load voltage Voc of the second photovoltaic or solar cell 12 or of a short-circuit current. At the beginning of the measurement, there is an increase in the current through the diode of the second photovoltaic cell 12 until reaching a voltage point Vmpp, which corresponds to the ideal operating voltage of the electronic circuit 3. However, the voltage-current curve terminates in a drop of current until reaching an off-load voltage value Voc on the voltage axis where the current becomes zero. An operating voltage of the electronic circuit close to the targeted maximum value Vmpp may be determined by the function of the voltage Vmpp=f(Voc).

Hence, the second photovoltaic cell 12 may be provided to measure at all times and in particular continuously a voltage or a current, for example the off-load voltage Voc, because this second photovoltaic or solar cell 12 is independent of the first photovoltaic or solar cell(s) 2, which are in charge of measuring the light energy by converting it into electrical energy.

This voltage measurement, for example of the off-load voltage Voc, is supplied to an adapter 4, which allows adapting the voltage to be transmitted to the switching controller 5 a value corresponding for example to 80% of the average maximum value originating from the adapter 4 and adapting the operating voltage accordingly, desirably close to Vmpp which may be the target value (Vmpp_cible) defined before. Thus, the desired operating voltage is supplied at the output Vsup of the switching controller 5 and is loaded on the positive side on an output capacitor Cs, connected to the ground Vss on the negative side.

Figure 1:
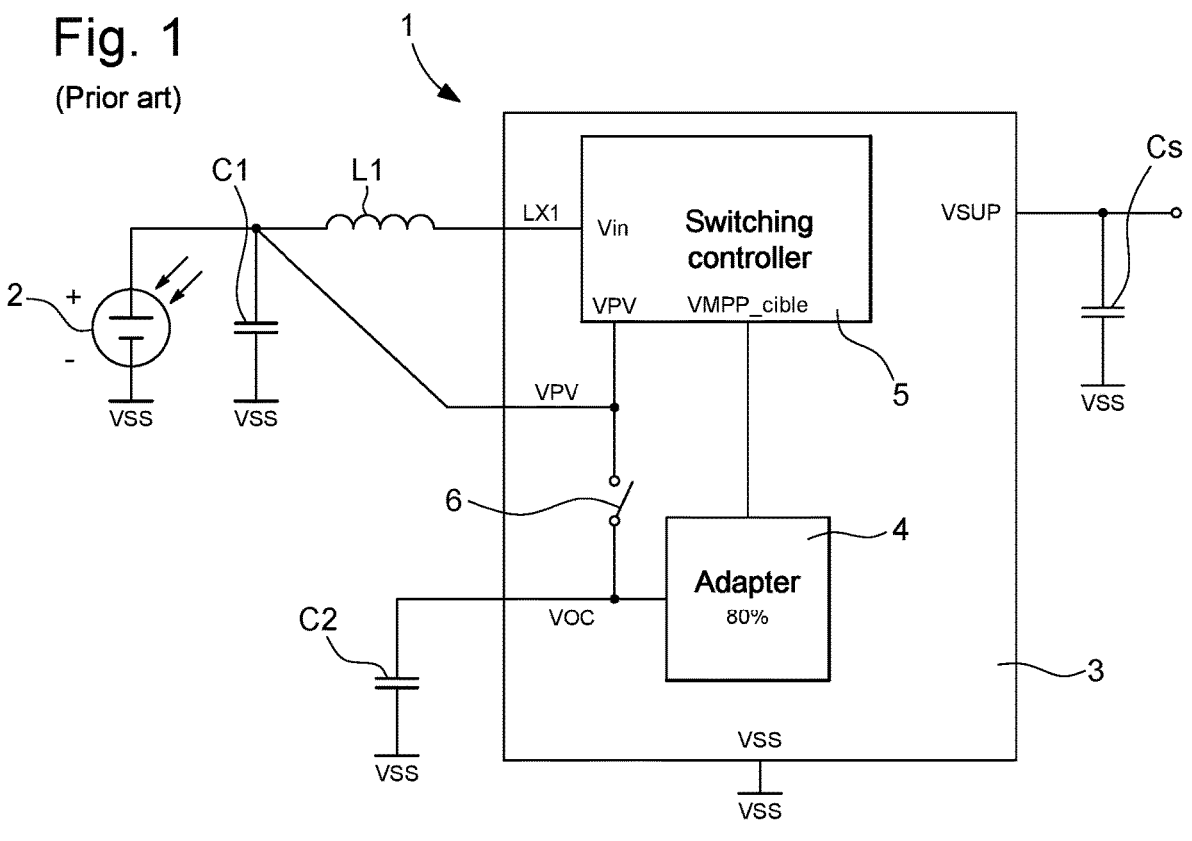
FIG. 1 shows a photovoltaic cell module of the prior art, which is provided with an electronic circuit for processing data and adapted for a measurement of the off-load voltage.

It should be noted that it could be provided to connect the photovoltaic cell module 1 with an electronic circuit 3 in a reverse manner with respect to a positive voltage terminal rather than with respect to the ground Vss as described in FIGS. 1 and 2 to describe the operation of said module 1.

Figure 3:
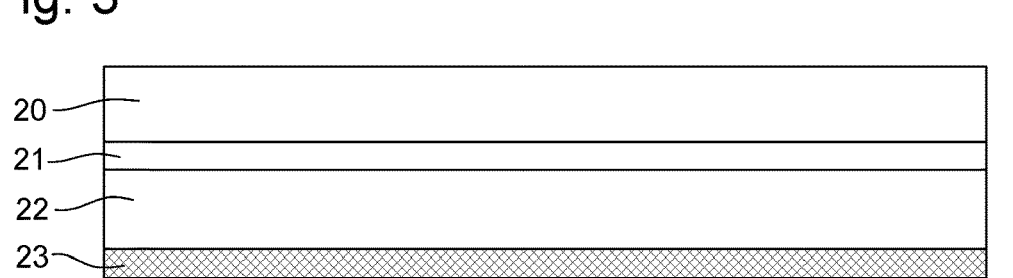
FIG. 3 shows an embodiment of the different layers of a photovoltaic cell set intended to be part of a photovoltaic cell module with an electronic cell of a first variant according to the present invention.

To make the photovoltaic cell 2, 12 module 1 with an electronic circuit 3 of the first variant, reference may first be made to FIG. 3. This FIG. 3 shows different layers of a photovoltaic cell set 10 intended to be part of a photovoltaic cell module 1 with an electronic circuit of a first variant of a set of layers of the module 1 before making the connection of the photovoltaic cells. The set 10 comprises a first conductive layer, which may be a transparent first conductive layer 21, intended to fasten the substrate 22 under a face of a support of the set.

The first conductive layer 21 may be arranged over a first face of a substrate 22 made of an amorphous-type material, for example made of a semiconductor material such as an amorphous silicon (a-Si). The first conductive layer 21 may be a transparent conductive oxide TCO layer, but it is possible to consider using other conductive layers. A second metallic layer 23 may be arranged over a second face opposite to the first face of the substrate 22 or of the support.

Hence, the material of the substrate 22 of the first photovoltaic cell 2 may be an amorphous silicon.

The second conductive layer 23 is connected to the first conductive layer 21 via a peripheral opening of the set 10 made in the substrate 22 or in the first photovoltaic cell 2.

Of course, several other layers may be placed over or under the above-described layers of the set.

The photovoltaic cell set 10 is intended to be fastened by its first conductive layer 21 over a lower face of a transparent support 20, such as a glass for example a watch glass or over another support type. The total thickness of the set 10 may be smaller than 500 μm and even preferably smaller than 100 μm.

It should be noted that in this first variant, the transparent support 20 or the support of another type may be part of the set 10 after all steps of connection of the electronic components and of the photovoltaic cells of the module 1.

Figure 4A:
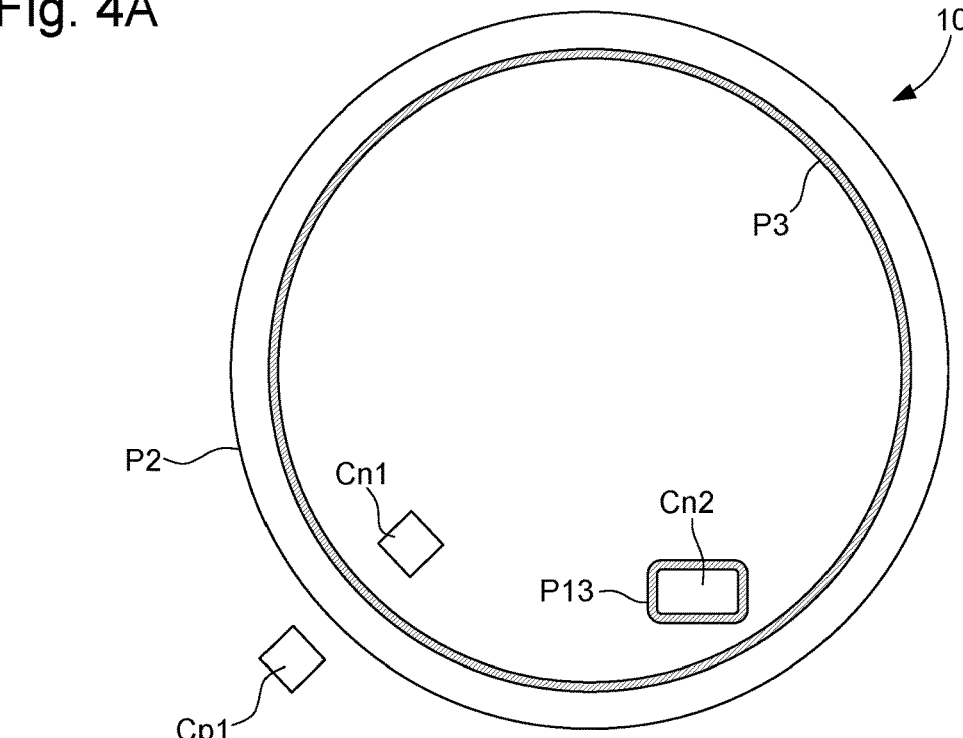
FIGS. 4A and 4B show, on the one hand in FIG. 4A, a top view of the support in the form of a wafer of the photovoltaic cell set for a photovoltaic cell module with an electronic circuit according to a first variant of the present invention and, on the other hand in FIG. 4B, a cross-sectional view of the photovoltaic cell set in the form of a wafer for viewing the different contacts f the measurement of a voltage, for example of the off-load voltage in the electronic circuit of the module and of electrical energy capture by light signals according to the present invention.
Figure 4B:
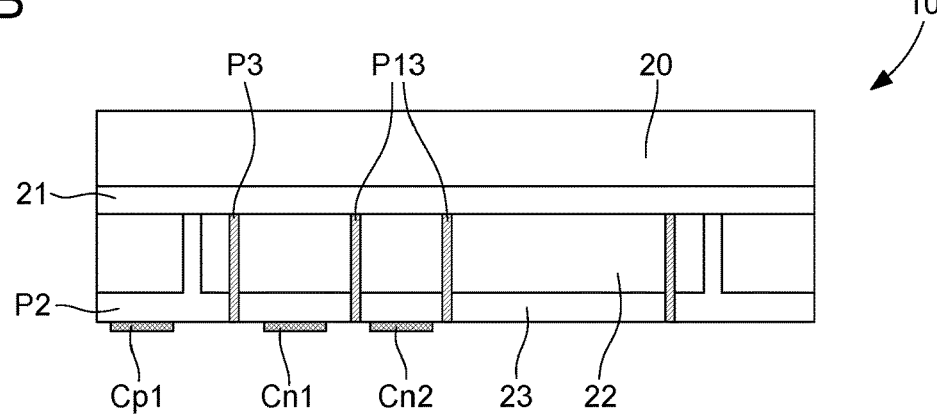

The first variant of the photovoltaic cell set 10 to be part of the photovoltaic cell module with an electronic circuit is shown in FIGS. 4A and 4B. FIG. 4A shows a top view of the photovoltaic cell set 10 while FIG. 4B shows a vertical view at the level of the connection contacts of the photovoltaic cell set 10.

According to the first variant, the photovoltaic cell set 10 comprises two cells arranged independent of each other. A large-size first photovoltaic cell 2 is arranged to collect the light energy, and convert it into electrical energy, while a small-size second photovoltaic cell 12 is arranged to perform the measurement of the off-load voltage Voc, and possibly of the short-circuit current.

The first photovoltaic cell 2 may be a thin-film cell arranged over a support of another shape type of a substrate.

Nonetheless, it should be noted that in FIGS. 4A and 4B, the substrate 22 is rather shown in the form of a wafer or wafer portion over which the electrical contacts of the photovoltaic cells are made and their location on the wafer. Said photovoltaic or solar cells are made primarily in one or more substrate wafer(s), which consist of silicon wafers or over one or more support(s) of a material made of glass, or of plastic, or of metal with an insulation layer, or over crystalline layers.

FIG. 4A shows a top view of the first variant of the photovoltaic cell set 10 intended to be part of the photovoltaic cell module with an electronic circuit. Conversely, FIG.

4B shows a cross-sectional view at the level of the position of the electrical contacts of the photovoltaic sensor set 10 fastened on the support 20, which is part of the set 10. The set 10 with its first layer fastened on the lower face of the support 20, which preferably consists of glass, it is possible to perform machining operation, in particular by laser. It may be provided for performing a machining or etching from the top of the glass through the module, given the transparency of glass and of some portions of the set like the transparent first conductive oxide layer. This consists of a variant for a thin-film cell over a support made of glass for example.

With the well-known laser machining, it is possible to perform said etching through the amorphous-type silicon substrate 22 so as to provide access to the transparent first conductive oxide layer 21 to polarise this layer at a positive or negative common potential preferably positive in this case. To do so, the second metallic layer 23 (defined P2) over the opposite face of the substrate 22 may connect the transparent first conductive oxide layer 21, for example by a metallic ring P2. A positive contact Cp1 arranged over this second metallic layer 23 at the boundary or periphery allows polarising the entirety of the transparent first conductive oxide layer 21 at the same potential for example a positive potential for both photovoltaic cells.

For example, by means of laser machining, it is also possible to make an insulation layer P3 for the large photovoltaic cell and another insulation layer P13 for the small photovoltaic cell. Each insulation layer P3 and P13 extends from the second metallic layer 23 at least until contact with the transparent conductive oxide layer 21. Thus, it is possible to apply a negative contact Cn1 over the large first photovoltaic cell over the substrate via the second metallic layer 23 insulated from the boundary P2. And this also allows insulating the small photovoltaic cell by the other insulation layer P13 so as to connect by another negative contact Cn2 over the small second photovoltaic cell over the substrate via the second metallic layer 23.

Of course, with regards to the case set out hereinabove, the supply common pad corresponds to a positive terminal of a power supply source, which primarily originates from the conversion of light energy into electrical energy by the first photovoltaic or solar cell. However, in the case set out in particular in FIG. 2, the common pad is rather the mass terminal defined as the negative side terminal. Yet, the connection arrangement of the different contact pads does not change.

An insulation P3 of the large first photovoltaic or solar cell, circular shaped in this case, yet without being limited to this shape shown in FIG. 4A, is provided. In addition, around this insulation P3, an interconnection line or strip P2 is provided to connect the positive connection common complementary contact Cp1 on the positive side of the first photovoltaic or solar cell and of the second photovoltaic or solar cell.

A positive contact Cp1 is arranged over the second conductive layer 23 at the periphery intended to allow polarising the first conductive layer 21 at the same positive potential for both photovoltaic cells, in that a negative contact Cn1 is arranged over the large photovoltaic cell 2 over the substrate via the second conductive layer 23 insulated from the boundary P2, and in that another negative contact Cn2 is arranged over the small photovoltaic cell 12 over the substrate via the second conductive layer 23.

Even though the second or small photovoltaic cell 12 is generally arranged in the first or large photovoltaic cell 2, it is nevertheless possible to consider also making it on the side external to the insulation P3 and up to the boundary P2.

It should also be noted that the photovoltaic cell set 10 mounted in the photovoltaic cell module with an electronic circuit, it is possible to consider reversing the polarity of the different contacts arranged on each photovoltaic cell. In this respect, the complementary contact Cp1 may become a negative side contact, while the first negative contact Cn1 and the other negative contact Cn2 may become contacts of the positive side, once the set 10 is mounted in the module 1.

Figure 5A:
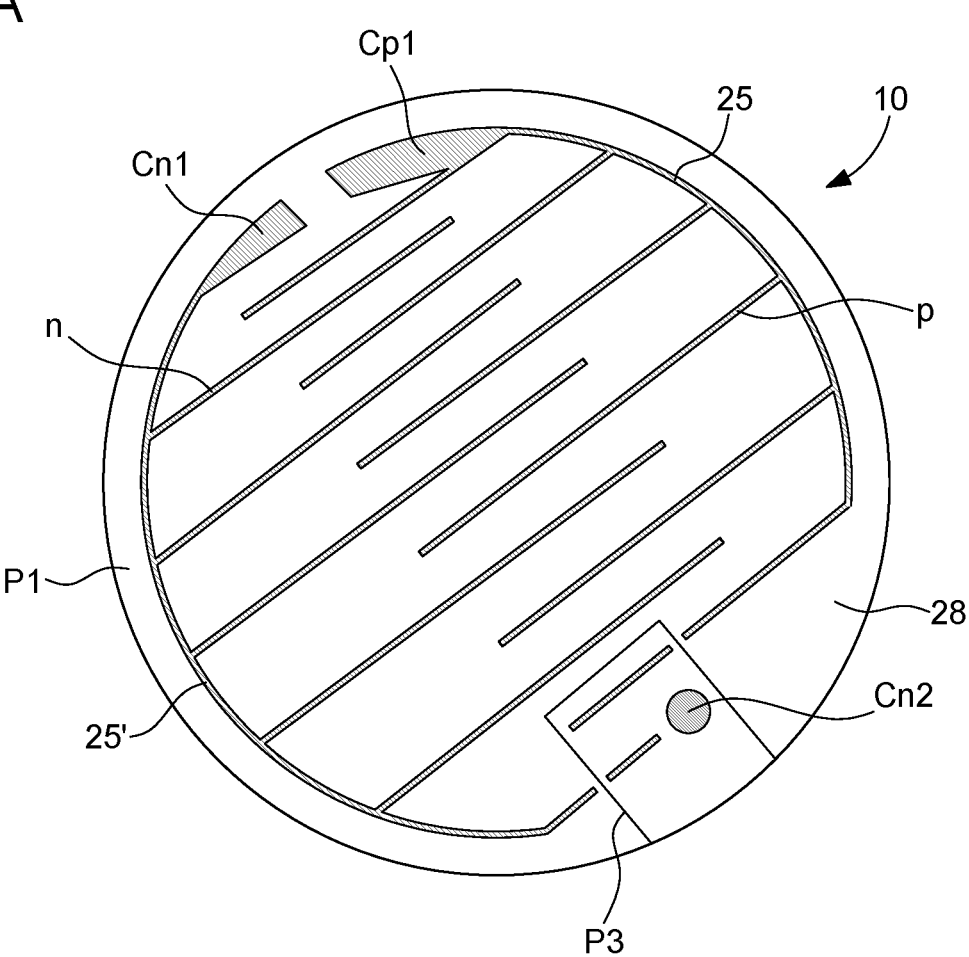
FIGS. 5A and 5B show, on the one hand in FIG. 5A, a top view of the support in the form of a wafer of the photovoltaic cell set for a photovoltaic cell module with an electronic circuit according to a second variant of the present invention and, on the other hand in FIG. 5B, a cross-sectional view of the photovoltaic cell set in the form of a wafer for viewing at least two teeth of each comb in alternation over a silicon crystalline layer for example according to the present invention.
Figure 5B:
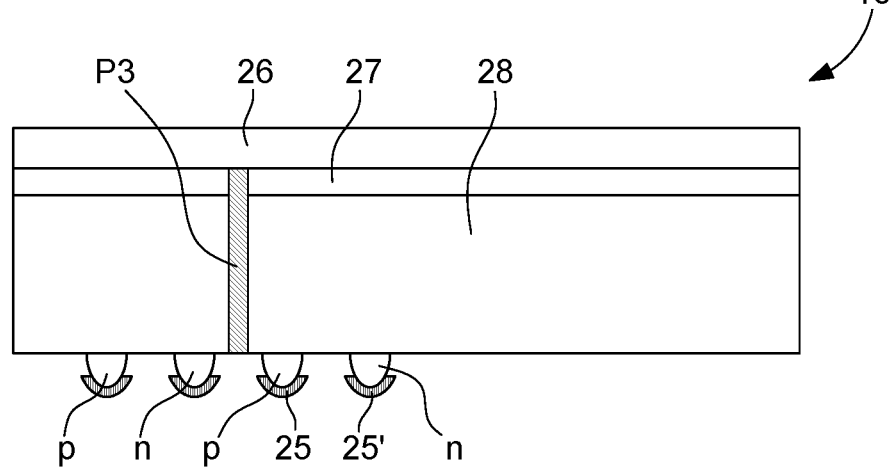

FIGS. 5A and 5B show the second variant of the photovoltaic cell set 10 with the entire electrical connection between the contacts, made at the back of the photovoltaic cell set 10 under the substrate 28 via at least one conductive layer 25, 25'. In this second variant, this consist in taking advantage of the particular characteristics of IBC-type (acronym for "interdigitated back contact") silicon cells. In this embodiment, the underlying idea is to implement an essentially single-segment cell for the monocrystalline substrate (wafer), and to segment or insulate only the rear structure of the wafer, for example by diffusion and metallisation. In other words, this consists in assigning a small area of the IBC cell to the measurement of the off-load voltage Voc or to the short-circuit current, by means of at least two puns or combs electrically independent under the substrate 28.

As one could notice in FIG. 5B, the photovoltaic cell set 10 is composed from the top to the bottom, of at least one passivation layer 27 arranged directly over the substrate 28, which may be composed of crystalline silicon. However, a silicon nitride SiN layer 26 serving as an anti-reflective layer or a silicon oxide SiO2 layer may also be added over the passivation layer 27. In addition, at least one p-type area and one n-type area, but preferably several p-type and n-type areas, may be made over the opposite face of the substrate 28. These areas are arranged in alternation spaced apart from one another and parallel to one another. These areas may be rectilinear or with a curvature, for example in the form of a circular arc or of another suitable shape. These areas are covered with the conductive layer which is subsequently structured to define a first comb 25 and a second comb 25'. The teeth of the first comb 25 are arranged over the p-type areas, while the teeth of the second comb are arranged over the n-type areas.

It should also be noted that a support or support element, which may be made of transparent glass, may be mounted or fastened on the anti-reflective layer 26, to protect it from any wear over time. In addition, one may also consider placing a protective layer over the combs 25, 25', also to protect them from any wear.

It should be noted that the n and p areas may be made by diffusion or deposition of layers of each respective type (for example amorphous Si doped with Boron B or with Phosphorus P.

Preferably, a first negative contact Cn1 is arranged proximate to the periphery P1 of the substrate 28 in which the photovoltaic cells are made. A positive complementary contact Cp1 is also made proximate to the periphery of the wafer slightly setback for example from the first negative contact Cn1. At least two conductive pins or preferably two conductive combs 25, 25', whose teeth are intended to interlock alternately and in parallel next to one another over the same surface at the back of the substrate 28, are formed starting from each of the contacts Cn1 and Cp1. In the case where the substrate 28 is circular shaped, this means that the holding line of each tooth of each comb 25, 25' describes a circular arc starting respectively from each of the contacts Cn1 and Cp1 and in a direction opposite to one another.

The interdigitated design may be replaced by other designs. In addition, it is not essential for making for example a double coil.

The second or other negative contact Cn2 is made between at least two conductive pins or between the conductive teeth of the combs without any electrical contact with either one. As shown in FIG. 5A, the second contact Cn2 may be arranged after the last tooth of the comb 25'. In addition, to insulate the last tooth from the rest of the comb 25', a break-up P3, preferably of the last two teeth 25, 25' of the rest of the comb, is made. One could obviously notice this break-up P3 allowing insulating the second photovoltaic cell from the first photovoltaic cell. Nonetheless, it should be noted that the small area intended to make the IBC-type second photovoltaic or solar cell should be well defined. However, it should be noted that this second photovoltaic or solar cell is necessarily smaller than the first photovoltaic or solar cell which is used to capture light energy and convert it into electrical energy.

This second embodiment or variant is more complicate to carry out or implement for measuring the off-load voltage. However, it consists of a variant to be taken into account.

The invention offers the major advantage of enabling a frequent and even permanent measurement of the voltage Voc, so as to be able to quickly adapt the operating point Vmpp. This advantage is even more essential as the lighting conditions change quickly and frequently, which is typically the case of a watch worn by an active user the dial of which comprises the first photovoltaic cell and the second photovoltaic cell for measuring the off-load voltage.

It should be noted that in the first variant, the creation of the mini-cell could be done quite easily within the usual production steps, while barely lengthening the duration of the process. In addition, the aesthetics of the first variant are not really a problem, because the created opening is filled with dark resin, thereby reducing the optical contrast.

Like with the first variant, the electrical connection terminals may be reversed according to the arrangement of the electronic circuit connected to these photovoltaic cells. A contact pad common to the mass rather than to the positive terminal of the power supply may be provided for. This leaves a positive variation of the adaptation voltage at the first photovoltaic or solar cell generating an electrical energy for the general power supply of the circuit or of the module as such. This also allows having an off-load voltage variation by adapting its voltage to determine the proper operation of the module and of its circuits.

Of course, several contact pads Cn1, Cn2, Cp1 may be provided over the wafer for a uniform polarisation of each portion for the proper operation of the module 1. In the case of making of the conductive combs from the first contact pad Cn1 and the complementary contact pad Cp1, the arrangement of the teeth of the two combs from the connecting line of these teeth should be quite regular for a good distribution or polarisation of the wafer. One could have imagined having each comb starting from a contact pad placed at the periphery of the wafer or in an almost central position of the wafer, but still with an alternation of teeth of each comb over the rear contact surface of the wafer. It is also possible to consider having each comb contact pad arranged at the periphery and substantially at 180° with respect to one another. However, the embodiment shown in FIG. 5B seems to be more conceivable with a good polarisation distribution by the arrangement of the teeth of the shown conductive combs. The length of each tooth could extend more than what is shown in FIG. 5B.

The above-described principle, aiming at facilitating the measurement of the off-load voltage Voc, may also be implemented to measure another major parameter of the photovoltaic cell, namely its short-circuit current Isc (short circuit). The knowledge of this current also allows optimising the operating point, even though, in practice, the off-load voltage Voc is preferred. This off-load voltage Voc is equal to In(I). But, above all, the short-circuit current varies in an almost-linear manner with the intensity of lighting, which enables an easy implementation of a luxmeter function. Once the overall behaviour of the system for capturing light and converting it into electrical energy is known, the integration of the measurement of the luxmeter allows estimating the collected amount of energy, which is a useful piece of information for optimising energy management and for informing the end user of the product.

It should also be noted, as a reminder, that the maximum power Pmpp corresponds to an operating point MPP, which is characterized by quite specific voltage Vmpp and current Impp, and depending on the lighting level. The previously-described maximum power point Pmpp tracking function concerns the voltage of the small cell, which also allows approximating a luxmeter function, in two distinct manners indicated hereinbelow:

The voltage Voc of the photovoltaic cell is a signal proportional to the logarithm of the irradiation. All it needs is to measure its value to deduce a lighting with a look-up table (voltage→lux), Alternatively, if a small resistance ($<<$Vmpp/Impp) is placed in parallel with the small photovoltaic cell, the latter will give a voltage proportional to the irradiation. All it needs is to measure its value to deduce a lighting with a look-up table (voltage→lux).

It should also be noted that the off-load voltage may be a measurement that takes account of the intensity of lighting of the photovoltaic cell set.

A small resistance may also "shunt" branch off from the small photovoltaic cell to measure an electrical voltage proportional to the operating or short-circuit current. This results in a linear variation of current and voltage.

Of course, other possible embodiments of the photovoltaic cell set may be considered by a person skilled in the art without departing from the scope of the invention defined by the claims.

The invention claimed is:

1. A photovoltaic cell set configured to be part of a photovoltaic cell module with an electronic circuit, comprising:

at least one large-size first photovoltaic cell, which is arranged to capture light energy to be converted into electrical energy in the module, at least one small-size second photovoltaic cell independent of the first photovoltaic cell, which is arranged to measure in the module a voltage or a current to adapt an operating point of the module, a substrate suited for making one or more photovoltaic cells, a first conductive layer arranged over a top face of the substrate, a second conductive layer arranged over a bottom face of the substrate, an insulation is made to define the first photovoltaic cell, and another insulation is made to make the second photovoltaic cell independent of the first photovoltaic cell so as to enable the second photovoltaic cell to perform the measurement of the voltage or of the current in the module, wherein the insulation and the another insulation extend at least from the first conductive layer through the substrate to the second conductive layer.

2. The set according to claim 1, wherein the first conductive layer is a first conductive layer that is mostly transparent, intended to fix the substrate under a face of a support element of the set.

3. The set according to claim 1, wherein the first photovoltaic cell is a thin-film cell arranged over a support in a form of a substrate.

4. The set according to claim 1, wherein a material of the first photovoltaic cell is an amorphous silicon.

5. The set according to claim 2, wherein the second conductive layer is connected to the first conductive layer by a peripheral opening of the set formed in the substrate or in the first photovoltaic cell.

6. The set according to claim 5, wherein a positive contact is arranged over the second conductive layer at the periphery intended to allow polarising the first conductive layer at the same positive potential for the two photovoltaic cells, wherein a negative contact is arranged over the large photovoltaic cell over the substrate via the second conductive layer insulated from a boundary, and wherein another negative contact is arranged over the small photovoltaic cell over the substrate via the second conductive layer.

7. The set according to claim 1, wherein portions of the set are made in the same colour as the first photovoltaic cell and/or the second photovoltaic cell so as not to be distinguishable through a watch glass.

8. The set according to claim 1, wherein the first photovoltaic cell is in a form of a dial or of a bezel or of a crystal of a watch, or of another portion of a watch.

9. The set according to claim 1, wherein the photovoltaic cells are made in one or more substrate wafers, which are silicon wafers, or over one or more supports of a material made of glass, or plastic, or metal with an insulation layer, or over crystalline layers.

10. The photovoltaic cell module with the electronic circuit comprising the photovoltaic cell set according to claim 1, wherein the at least one large-size first photovoltaic cell is arranged to capture the light energy to be converted into the electrical energy, the module also comprising in the electronic circuit, a switching controller and an adapter for adapting the operating point of the module, and wherein the at least one small-size second photovoltaic cell independent of the first photovoltaic cell, is arranged to measure in the module the voltage or the current for adapting the operating point of the module.

11. The module according to claim 10, wherein the measured voltage is an off-load voltage of the second photovoltaic cell which is a signal proportional to a logarithm of irradiation.

12. The module according to claim 10, wherein a small resistance branches off from the second photovoltaic cell to measure an electrical voltage proportional to an operating or a short-circuit current.

13. A photovoltaic cell set configured to be part of a photovoltaic cell module with an electronic circuit, comprising:

at least one large-size first photovoltaic cell, which is arranged to capture light energy to be converted into electrical energy in the module, at least one small-size second photovoltaic cell independent of the first photovoltaic cell, which is arranged to measure in the module a voltage or a current to adapt an operating point of the module, a substrate at a back of which p-type and n-type areas are formed in alternation and in parallel, and a conductive layer arranged over the p-type and n-type areas while being structured so as to define a first comb and a second comb, teeth of the first comb being arranged above the p-type areas, while teeth of the second comb being arranged above the n-type areas.

14. The set according to claim 13, further comprising from top to bottom, at least one passivation layer arranged directly over an upper face of the substrate, while the conductive layer is arranged over a lower face of the substrate.

15. The set according to claim 13, wherein the substrate is a crystalline substrate made of silicon.

16. The set according to claim 14, wherein an anti-reflective layer is arranged over the passivation layer.

17. The set according to claim 13, wherein the p-type and n-type areas and the teeth of the combs are rectilinear.

18. The set according to claim 13, wherein the p-type and n-type areas and the teeth of the combs are curved or arcuate.

19. The set according to claim 13, wherein the first comb is connected to a first positive contact, while the second comb is connected to a first negative contact in connection with the first photovoltaic cell, and wherein a second negative contact is to be connected to a first tooth of the second comb or two teeth of the first and second combs insulated from rest of the first and second combs by an insulation break-up.

* * * * *